(12) United States Patent
Maier et al.

(10) Patent No.: US 9,342,053 B2
(45) Date of Patent: May 17, 2016

(54) METHOD FOR MAKING A TIMEPIECE COMPONENT

(71) Applicant: PATEK PHILIPPE SA GENEVE, Geneva (CH)

(72) Inventors: Frédéric Maier, Neuchâtel (CH); Stéphane Von Gunten, La Chaux-de-Fonds (CH); Sylvain Jeanneret, Colombier (CH)

(73) Assignee: PATEK PHILIPPE SA GENEVE, Geneva (CH)

( * ) Notice: Subject to any disclaimer, the term of this patent is extended or adjusted under 35 U.S.C. 154(b) by 184 days.

(21) Appl. No.: 14/103,243

(22) Filed: Dec. 11, 2013

(65) Prior Publication Data

US 2014/0096392 A1     Apr. 10, 2014

Related U.S. Application Data

(62) Division of application No. 12/522,666, filed as application No. PCT/IB2008/000345 on Feb. 15, 2008, now Pat. No. 8,636,403.

(30) Foreign Application Priority Data

May 8, 2007   (CH) ...................................... 0748/07

(51) Int. Cl.
   *G04B 5/16*   (2006.01)
   *G04B 13/02*   (2006.01)
   (Continued)

(52) U.S. Cl.
   CPC .............. *G04D 3/00* (2013.01); *B81C 99/0085* (2013.01); *B81C 99/0095* (2013.01);
   (Continued)

(58) Field of Classification Search
   CPC ...... G04B 5/165; G04B 13/26; G04B 17/063; G04B 13/026; B81B 2201/035; B81C 99/0085; B81C 99/0095
   USPC ................. 368/124, 127, 168, 169, 322–326; 29/896.31
   See application file for complete search history.

(56) References Cited

U.S. PATENT DOCUMENTS

| 322,093 A | 7/1885 | Davies |
| 2,936,571 A | 5/1960 | Biemiller |

(Continued)

FOREIGN PATENT DOCUMENTS

| CH | 339868 A | 7/1959 |
| CH | 17517/71 D | 2/1975 |

(Continued)

OTHER PUBLICATIONS

Machine Translation of EP732635, retrieved from the internet Aug. 9, 2015.*

(Continued)

*Primary Examiner* — Vit W Miska
(74) *Attorney, Agent, or Firm* — Bacon & Thomas, PLLC

(57) ABSTRACT

A method of manufacturing a timepiece component, such as a balance, an oscillating mass or a wheel, comprises a micro-manufacturing technique, such as the DRIE technique. The method may comprise forming at least one member in or at the periphery of the structure, of a material different from that of the structure. This member is typically metal and is formed by electro-forming using a cavity of the structure as a mold.

15 Claims, 7 Drawing Sheets

(51) Int. Cl.
   *G04B 17/06* (2006.01)
   *G04D 3/00* (2006.01)
   *B81C 99/00* (2010.01)
   *G04F 7/08* (2006.01)

(52) U.S. Cl.
   CPC ............ *G04B 5/165* (2013.01); *G04B 13/026* (2013.01); *G04B 17/063* (2013.01); *G04D 3/0069* (2013.01); *G04F 7/08* (2013.01); *B81B 2201/035* (2013.01); *Y10T 29/49579* (2015.01); *Y10T 29/49581* (2015.01)

(56) References Cited

U.S. PATENT DOCUMENTS

| | | |
|---|---|---|
| 3,161,012 A | 12/1964 | Hug et al. |
| 3,942,317 A | 3/1976 | Schluep |
| 4,057,885 A | 11/1977 | Giger et al. |
| 6,354,731 B1 | 3/2002 | Halter |
| 2005/0126917 A1* | 6/2005 | Morimoto ................ 205/50 |
| 2006/0055097 A1 | 3/2006 | Conus et al. |
| 2007/0140065 A1 | 6/2007 | Levingston |

FOREIGN PATENT DOCUMENTS

| | | |
|---|---|---|
| EP | 0 732 635 A1 | 9/1996 |
| EP | 0 957 414 A1 | 11/1999 |
| EP | 1 655 642 A2 | 5/2006 |
| EP | 1 850 193 A1 | 10/2007 |
| FR | 1 275 357 A | 11/1961 |

OTHER PUBLICATIONS

Machine Translation of CH 339868, retrieved from the internet Aug. 9, 2015.*
International Search Report in PCT/IB2008/000345, Mar. 5, 2009.
Debbie G. Jones et al., Fabrication of Ultra Thick Ferromagnetic Structures in Silicon, Proceeding os IMECE04, 2004 ASME International Mechanical Engineering Congress and Exposition, Nov. 13-20, 2004, Anaheim, CA, IMECE2004-61909, pp. 25-28.

* cited by examiner

Fig.10
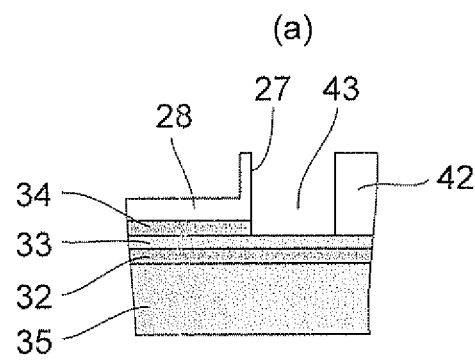
(a)
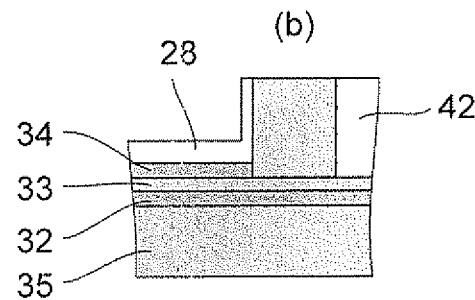
(b)
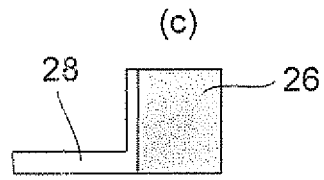
(c)

METHOD FOR MAKING A TIMEPIECE COMPONENT

FIELD OF INVENTION

The present invention relates to a timepiece component and its method of manufacture.

More particularly, the present invention relates to a timepiece component formed using a micro-manufacturing technique.

BACKGROUND

Some timepiece components, i.e., balance springs and wheels, are manufactured from silicon nowadays. Silicon is useful owing to its lightness, its resiliency, its non-magnetic properties and for its ability to be machined by micro-manufacturing techniques, in particular by the deep reactive-ion etching (DRIE) technique.

However, silicon does have some disadvantages: it is fragile, in other words it does not have any plasticity, which makes it difficult for example to attach a silicon wheel to an axle. Moreover, its extreme lightness does not permit components such as a balance or oscillating mass, which must have sufficient inertia or unbalance, to be formed completely from silicon and to be formed with small dimensions.

Materials other than silicon, themselves also able to be machined by micro-manufacturing techniques, and whose use could be envisioned for manufacturing timepiece components, have the same disadvantages. These materials are, in particular, diamond, quartz, glass and silicon carbide.

SUMMARY

The present invention aims to enable the micro-manufacturing of timepiece components for applications which have heretofore not been envisioned owing to the said disadvantages of the materials used.

To this end, there is provided a timepiece component comprising a structure which can be formed by a micro-manufacturing technique, characterised in that it further comprises at least one element formed in or at the periphery of the structure and formed of a material different from that of the structure.

The said element can modify the mechanical properties of the component to make this component usable in a given application whilst maintaining the advantages of the material used to form the structure. This element can be used, for example, to increase the inertia/mass ratio of a balance or the unbalance/mass ratio of an oscillating mass, or to absorb locally some of the stresses generated by the driving of an axle. It will be noted that the said element is formed in or at the periphery of the structure and is not added thereto. The entire timepiece component can thus be manufactured by micro-manufacturing techniques, i.e., techniques permitting precision in the order of microns. The said element thus does not impair the manufacturing precision of the component.

The present invention also proposes a method of manufacturing a timepiece component, comprising a step of forming a structure by a micro-manufacturing technique, characterised in that it further comprises a step consisting of forming at least one element in or at the periphery of the structure, said element being of a material different from that of the structure, such that the final timepiece component comprises said structure and said element.

BRIEF DESCRIPTION OF THE DRAWINGS

Other features and advantages of the present invention will become clear upon reading the following detailed description of several embodiments of the invention with reference to the accompanying drawings, in which:

FIG. 10 schematically shows a method of manufacturing the oscillating mass shown in FIG. 6.

DETAILED DESCRIPTION OF VARIOUS EMBODIMENTS OF THE DISCLOSURE

Figure 1:
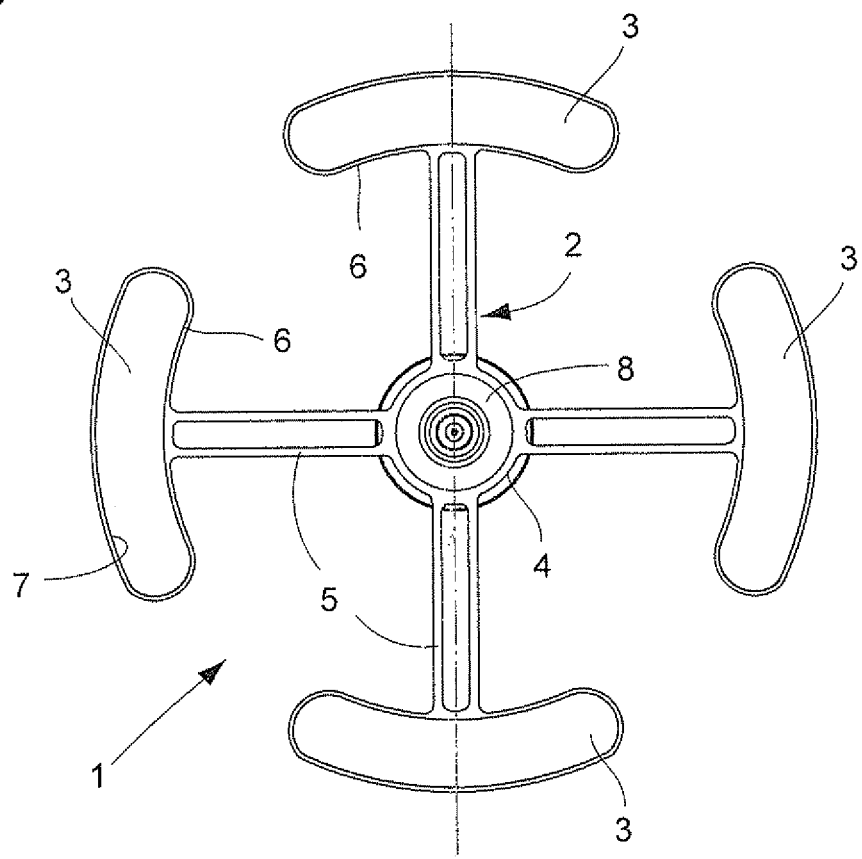
FIGS. 1 and 2 are respectively a top, plan view and an axial, cross-sectional view of a balance in accordance with the invention.

With reference to FIG. 1, a balance 1 in accordance with the invention for a timepiece movement comprises a main silicon structure 2 and metal elements 3. The silicon structure 2 comprises an annular central part 4, arms 5 which extend radially from the central part 4 and, at the end of these arms 5, closed contours 6 which define through-going cavities 7, e.g., in the form of a bean. The cavities 7 are filled by the metal elements 3, respectively, and form separate rim segments with these elements 3.

The metal elements 3 are formed of a material having a higher density than silicon. They thus make the periphery of the balance 1 heavier and increase the inertia of the balance to achieve a desired inertia. The inner part of the balance 1, formed by the central part 4 and the arms 5, is extremely lightweight owing to the fact that it is formed of silicon and that it is largely hollow. Since the inner part of a balance contributes less to the inertia than the peripheral part, a large inertia/mass ratio can be achieved. Thus, with the same inertia as a traditional metal balance, the total mass of the balance 1 is smaller. This is advantageous, in particular, in that it decreases the friction on the pivots of the axle of the balance in the bearings.

In an alternative embodiment, the rim could be continuous, i.e., the rim segments 3, 6 could be in contact with each other.

The metal elements 3 are typically formed of gold; however, they could be formed of another metal, in particular another metal having a high density such as platinum.

The silicon structure 2 and the metal elements 3 are formed by micro-manufacturing or micro-forming techniques. The balance 1 can thus be manufactured with a high degree of precision. Its inertia will thus be precise, which will facilitate its pairing with a balance spring to obtain a desired frequency for the balance spring regulator device of the timepiece movement. An example of the manufacturing process of the balance 1 will be described hereinafter.

Figure 2:
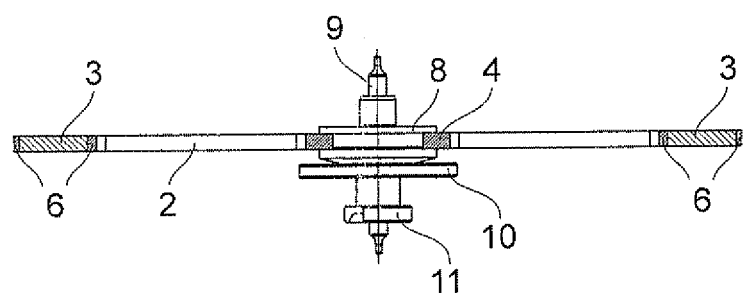

As shown in FIG. 2, the metal elements 3 are in the same plane as the silicon structure 2 and have the same constant height as the latter. In this manner, the metal elements 3 can take up a large volume without increasing the height of the balance 1. However, as an alternative, the metal elements 3 could extend beyond the cavities 7 in order, e.g., to reinforce the holding of these elements 3 in the silicon structure 2.

The balance 1 can be mounted on its axle by placing, as shown in FIGS. 1 and 2, an annular piece 8 formed of a soft metal material, such as gold, into the central part 4 of the silicon structure 2 and by driving the axle of the balance, designated by the reference numeral 9, into this annular piece 8. The annular piece 8 is sized so as to be deformed when the axle 9 is driven in and thus to absorb some of the stresses exerted by the axle 9 to prevent the silicon from breaking In FIG. 2, the reference numerals 10 and 11 designate the large roller and the small roller of the escapement mechanism.

Figure 3:
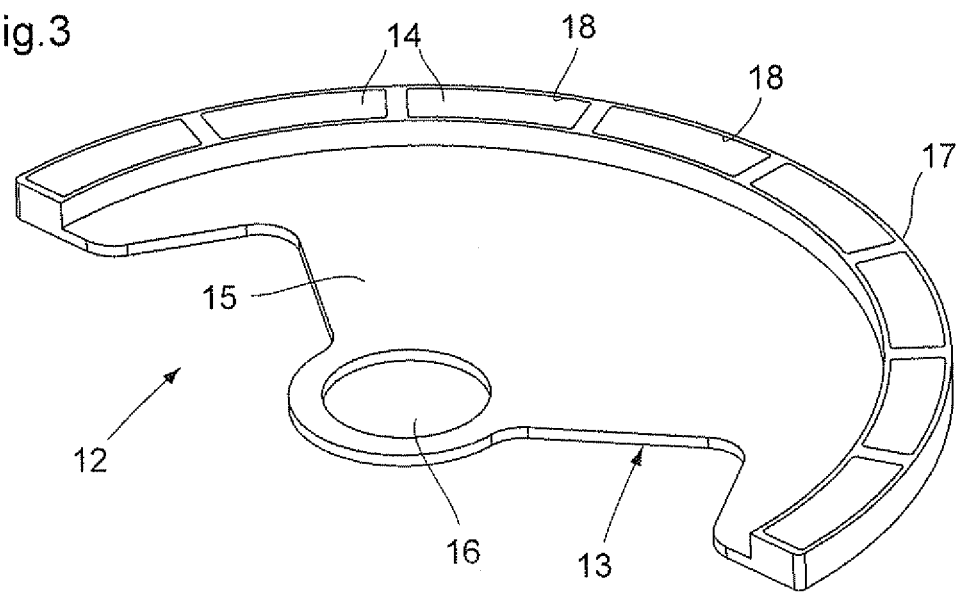
FIG. 3 is a perspective view of an oscillating mass in accordance with the invention.

Referring to FIG. 3, an oscillating mass 12 in accordance with the invention for an automatic winding mechanism of a timepiece comprises a main silicon structure 13 and metal elements 14. The silicon structure 13 comprises a thin main part 15 comprising a hole 16 for mounting the oscillating mass 12 on an axle or ball bearing, and a thicker peripheral part 17. The oscillating mass 12 can be mounted on its axle or its ball bearing in the same manner as the balance 1, i.e., using an intermediate piece formed of a soft material.

The metal elements 14 fill respective through-going cavities 18 in the thick peripheral part 17. The metal elements 14 are formed of a material having a higher density than silicon, e.g., gold or platinum. They thus make the periphery of the oscillating mass 12 heavier and increase its unbalance to obtain a desired unbalance. The inner part 15 of the oscillating mass 12 is thus extremely lightweight since it is formed of silicon and is thin. This inner part 15 could be hollowed out to be made even more lightweight. Since the inner part of an oscillating mass contributes less to the unbalance than the peripheral part, a large unbalance/mass ratio can be achieved. Thus, with the same unbalance as a traditional metal oscillating mass, the total mass of the oscillating mass 10 is smaller. This is advantageous, in particular, in that it decreases friction. An example of the manufacturing process of the oscillating mass 12 will be described hereinafter.

Figure 4:
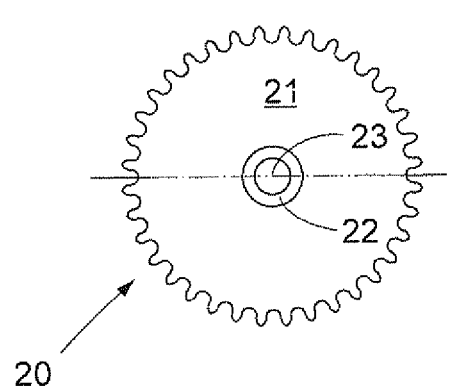
FIGS. 4 and 5 are respectively a top, plan view and an axial, cross-sectional view of a wheel in accordance with the invention.
Figure 5:
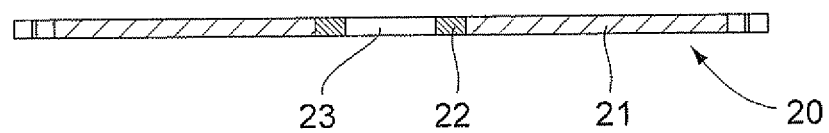

Referring to FIGS. 4 and 5, a toothed wheel 20 in accordance with the invention for a timepiece mechanism comprises a main silicon structure 21 and an annular metal element 22 formed in a central through-going cavity in the structure 21. An axle can pass through the central hole 23 in the element 22. The diameter of this central hole 23 is selected to be less than the diameter in the axle so as to allow the wheel 20 to be mounted on the axle by driving. Since the material of which the element 22 is formed, e.g., gold or nickel, has a high degree of deformability, in contrast to silicon, some of the stresses exerted by the axle will be absorbed by the element 22, which will prevent the silicon from breaking An element such as element 22 thus constitutes a means of locally absorbing the driving stresses, without impairing the manufacturing precision of the component since, as will be seen hereinafter, the element 22 can be formed by a micro-manufacturing or micro-forming technique.

It will be seen that a metal element such as element 22 shown in FIGS. 4, 5 could also be formed in the central cavity of the silicon structure of the balance 1 or of the oscillating mass 12 and could replace the annular piece 8.

Furthermore, in the illustrated example, the element 22 has the same height as the silicon structure 21. In an alternative embodiment, the element 22 could have a greater height than the structure 21 in order to define, for example, a pinion which is co-axial to the wheel 20 and is fixedly attached thereto. An exemplified method for manufacturing this alternative embodiment will be described hereinafter.

Figure 6:
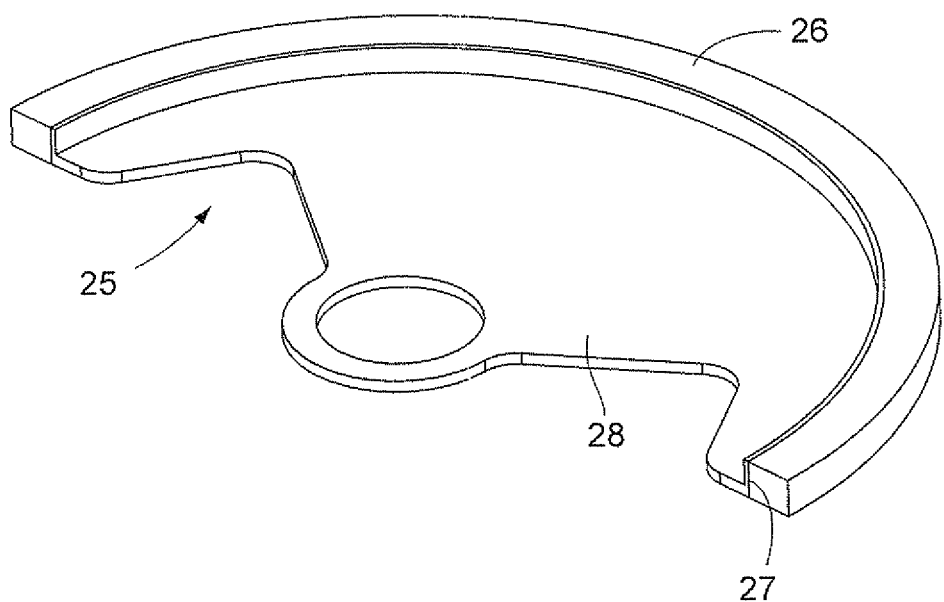
FIG. 6 is a perspective view of an oscillating mass in accordance with another embodiment.

FIG. 6 shows an oscillating mass 25 in accordance with an alternative embodiment of the invention. This oscillating mass 25 differs from the oscillating mass 12 illustrated in FIG. 3 by virtue of the fact that the metal elements 14 are replaced by a metal element 26 formed on a peripheral surface 27 of the main silicon structure, designated by the reference numeral 28. The element 26 has a circular arc shape and extends over the whole length and height of the surface 27. In order to reinforce the connection between the element 26 and the silicon structure 28, anchoring protrusions embedded in the element 26 can be provided on the peripheral surface 27. An exemplified method of manufacturing the oscillating mass 25 will be described hereinafter. In a manner similar to the element 26, a circular metal element could be formed on a peripheral surface of a silicon structure, either continuously or non-continuously, to manufacture a balance for example.

Figure 7:
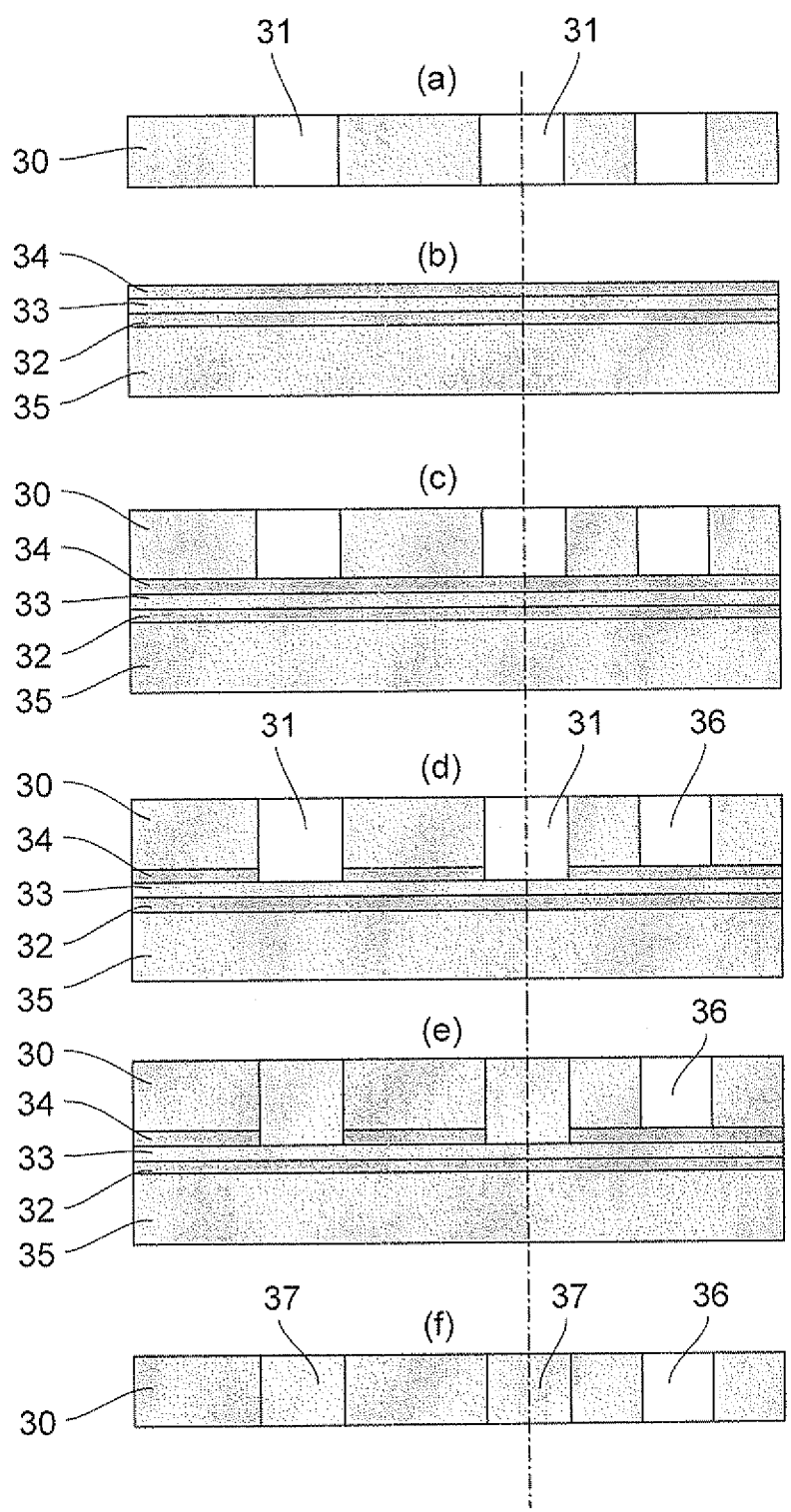
FIG. 7 schematically shows a method of manufacturing a timepiece component such as those shown in FIGS. 1 to 3.

FIG. 7 schematically shows an exemplified method of manufacturing the components illustrated in FIGS. 1, 2 and 3. In a first step (FIG. 7a), the silicon structure 30 of the component, with its cavity or cavities 31, is formed by deep reactive-ion etching (DRIE). For reasons of simplicity, the structure 30 is illustrated as having only a single height. In the case of the balance 1, a single DRIE step is necessary. In the case of the oscillating mass 12, two DRIE steps are carried out to produce the thin part 15 and the thick part 17. In a second step (FIG. 7b), a first layer of photosensitive resin 32, a metal layer 33 and a second layer of photosensitive resin 34 are successively formed on a support plate 35 formed of silicon or pyrex for example. In a third step (FIG. 7c), the support plate 35 with its layers 32, 33, 34 and the silicon structure 30 are adhesively joined together, the photosensitive resin layer 34 being used as the adhesive. In a fourth step (FIG. 7d), the exposed portions of the photosensitive resin 34, i.e., the portions facing the cavities 31, are removed by a photolithographic method using the silicon structure 30 as a mask. In a fifth step (FIG. 7e), metal is formed in the cavities 31 by electroforming (galvanic growth) from the exposed portions of the metal layer 33 and by using the silicon walls of the cavities 31 as moulds. Then, the plate 35 and the layers 32, 33, 34 are removed (FIG. 7f) leaving the silicon structure 30 with the metal elements 37 formed in the initial cavities 31, and a levelling operation is carried out, for example by lapping, to provide the elements 37 with the same height as the structure 30.

During the fourth and fifth steps, some areas 36 can be masked in a manner known per se so as not to be subjected to electroforming. These areas 36 are, for example, empty spaces between silicon parts which have been left during the DRIE process to form bars keeping the structure 30 attached to other structures formed simultaneously in a single plate. These bars are broken at the end of the manufacturing process to separate the components.

The support plate 35 and the silicon structure 30 can be joined together (third step; FIG. 7c) in a different manner from that described above, e.g., by thermo-compression of the metal layer 33 against the structure 30 (in this case, the photosensitive resin layer 34 is omitted) or by replacing the photosensitive resin layer 34 by dried liquid silicon oxide.

More details regarding the method described above can be found in the article by Debbie G. Jones and Albert P. Pisano entitled "Fabrication of ultra thick ferromagnetic structures in silicon", Proceedings of IMECE04, 2004 ASME International Mechanical Engineering Congress and Exposition, 13-20 Nov. 2004, Anaheim, Calif., USA, in which a similar method is described for manufacturing ferromagnetic structures in silicon.

Figure 8:
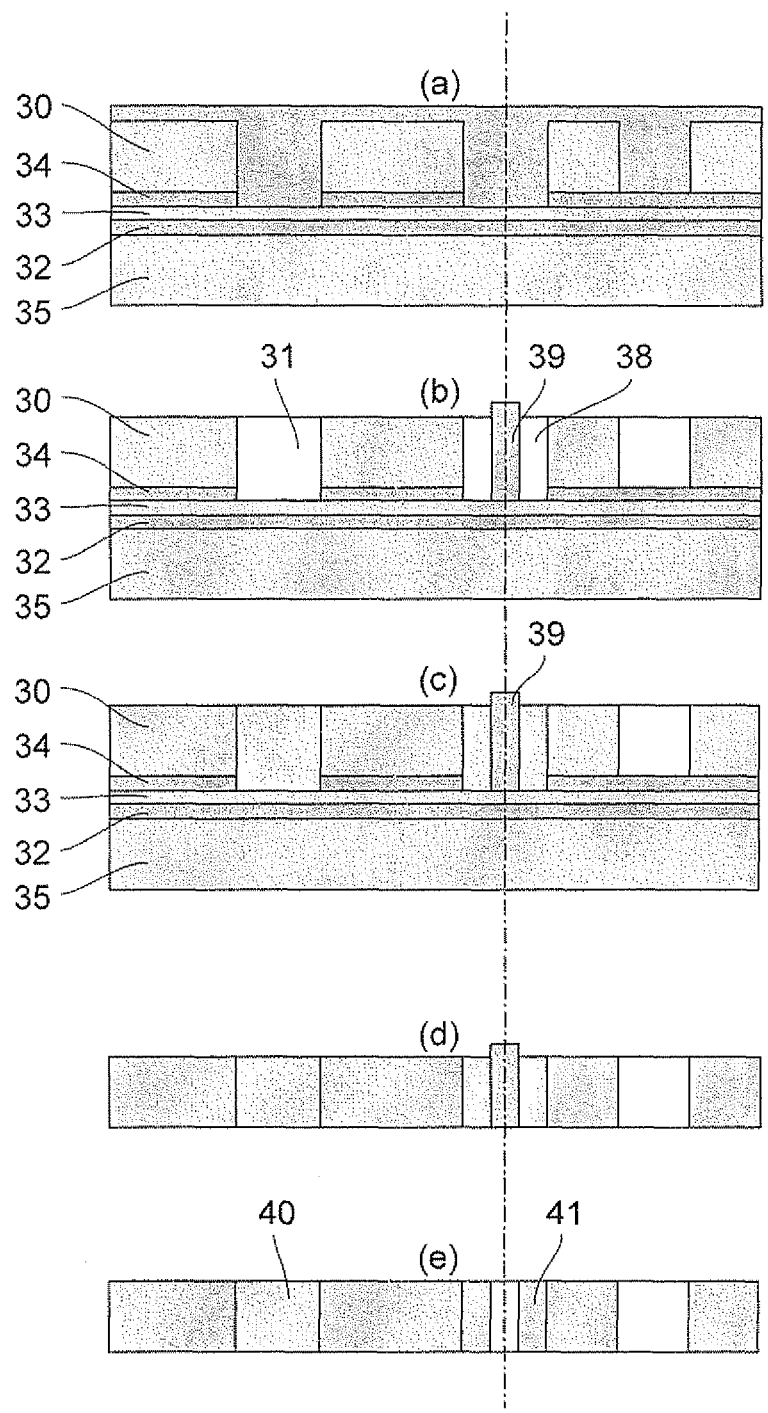
FIG. 8 schematically shows a method of manufacturing a timepiece component such as that shown in FIGS. 4 and 5.

FIG. 8 schematically shows how a central annular metal element such as element 22 illustrated in FIGS. 4 and 5 can be formed. FIG. 8 shows more precisely how this central element can be formed simultaneously with peripheral elements. The first four steps are similar to the steps of FIGS. 7a to 7d respectively. A fifth step, shown in FIG. 8a, consists of filling the cavities 31 of the silicon structure 30 with a photosensitive resin such as an SU-8 resin. A sixth step (FIG. 8b) consists of removing this SU-8 resin by a photolithographic method, except in a central part of the central cavity 38 corresponding to the hole in the central metal element. A seventh step (FIG. 8c) consists of forming metal in the cavities 31, 38. In the central cavity 38, this metal is formed only around the remaining portion 39 of the SU-8 resin. Then, the support plate 35 with its layers 32, 33, 34 is removed (FIG. 8d) and the remaining portion 39 of the SU-8 resin is removed (FIG. 8e). One or more peripheral metal elements 40, which are used for example to increase the inertia of the component, and a central annular element 41, enabling the driving of an axle for example, are thus obtained.

Figure 9:
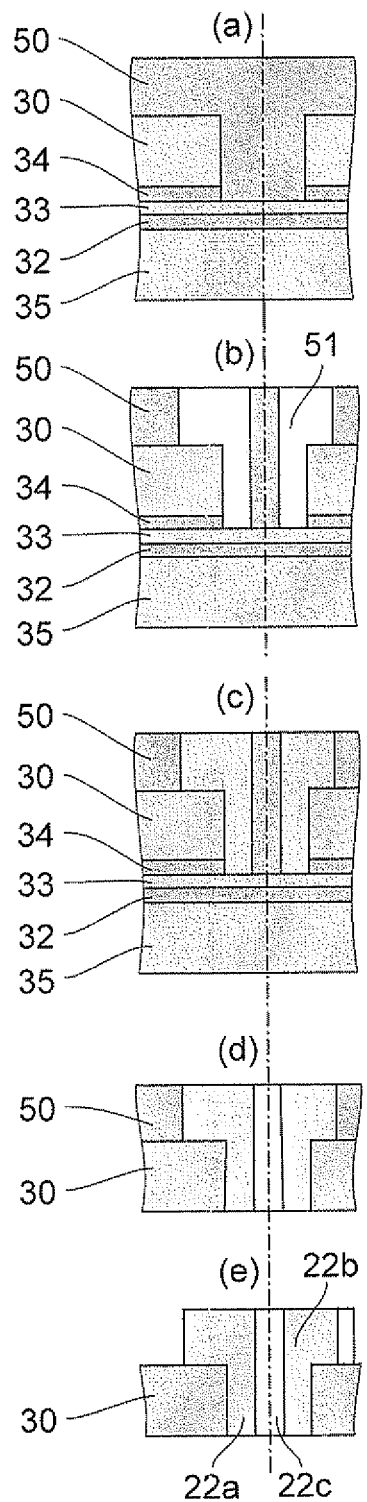
FIG. 9 schematically shows a method of manufacturing a wheel and a pinion.

FIG. 9 schematically shows an exemplified method of manufacturing a component comprising an annular central metal element such as element 22 illustrated in FIGS. 4 and 5 but having a greater height to define a pinion. The first four steps are similar to the steps of FIGS. 7a to 7d respectively. A fifth step, shown in FIG. 9a, consists of forming photosensitive SU-8 resin 50 in the central cavity of the silicon structure 30 and beyond this cavity, on the upper surface of the silicon structure 30. A sixth step (FIG. 9b) consists of photo-structuring the photosensitive resin 50 so as to define, with the silicon structure 30, a cavity 51 having the form of the annular central element and of its pinion. A seventh step (FIG. 9c) consists of electroforming metal in the cavity 51. The support plate 35 with its layers 32, 33, 34 and the photosensitive resin 50 are then removed (FIGS. 9d and 9e), leaving a silicon structure 30 and an annular metal element 22a formed in the structure 30 and extending beyond this structure 30 to define a pinion 22b. A central hole 22c passes through the combination 22a, 22b, into which hole an axle can be driven. In alternative embodiments, the annular element 22a could define elements other than a pinion, e.g., a cam or a chronograph heart-piece.

FIG. 10 schematically shows how the metal element 26 of the oscillating mass 25 illustrated in FIG. 6 can be formed. In first steps (FIG. 10a), the silicon structure 28 is formed by two DRIE steps, a support plate 35 with successive layers of photosensitive resin 32, of metal 33 and of photosensitive resin 34 is joined to the structure 28, the portion of the photosensitive resin 34 located outside the structure 28 is removed to expose the metal layer 33 and then a portion of photosensitive SU-8 resin 42 is formed outside the structure 28, in a similar manner to the portion 39 of FIG. 8, to form a cavity 43 with the silicon structure 28. In a following step (FIG. 10b), metal is electroformed in the cavity 43. In following steps (FIG. 10c), the plate 35 with its layers 32, 33, 34 and then the resin 42 are removed.

In all of the methods described above, the silicon structure is generally covered by a silicon oxide layer prior to the electroforming step. This layer is the result of the natural oxidation of the silicon. Its thickness can be increased by placing the silicon structure in an oxidation oven prior to electroforming. The silicon oxide in fact improves some mechanical properties of the silicon such as the coefficient of friction or mechanical strength. Other coatings can also be deposited on the silicon structure if desired. It will thus be understood that the metal elements are not necessarily in direct contact with the silicon but can be in contact with silicon oxide walls or with a particular coating.

In addition to a high level of precision, it will be appreciated that the methods of manufacturing the components in accordance with the invention described above enable a large number of components to be formed simultaneously from a single plate.

Although the invention has been described above for silicon structures, it could be applied to other materials which can be machined by micro-manufacturing techniques, in particular by the DRIE technique, such as diamond, quartz, glass or silicon carbide.

The invention claimed is:

1. A method of manufacturing a timepiece component, comprising the steps:
   forming a structure of a first material by a micro-manufacturing technique, said structure having a periphery; and
   forming at least one element in said structure or at the periphery of said structure, said element being of a second material different from the first material, such that the final timepiece component comprises said structure and said element, and such that said element forms a single piece with the structure,
   wherein the step of forming said element comprises depositing said second material in a cavity at least partly defined by the structure, using said cavity as a mold.

2. The method as claimed in claim 1, wherein said second material is a metal.

3. The method as claimed in claim 2, wherein the step of forming said element is effected by electroforming.

4. The method as claimed in claim 1, wherein the step of forming the structure is effected using a DRIE technique.

5. The method as claimed in claim 1, wherein the structure is formed from silicon.

6. The method as claimed in claim 1, wherein the structure is formed from diamond, quartz, glass or silicon carbide.

7. The method as claimed in claim 1, wherein the cavity is wholly defined by the structure.

8. The method as claimed in claim 1, wherein the cavity is defined partly by the structure and partly by a photosensitive resin.

9. The method as claimed in claim 8, wherein the step of forming said element comprises depositing said second material in the cavity defined by the structure and by the photosensitive resin formed on the outside of the structure such that after removal of the photosensitive resin said element is formed on a peripheral surface of the structure.

10. A method for manufacturing a balance comprising the method as claimed in claim 1, further comprising the step placing said element at the periphery of the structure to obtain an increased inertia/mass ratio of the balance.

11. A method for manufacturing an oscillating mass for an automatic winding mechanism comprising the method as claimed in claim 1, further comprising the step placing said element at the periphery of the structure to obtain an increased unbalance/mass ratio of the oscillating mass.

12. The method as claimed in claim 8, wherein said cavity comprises the photosensitive resin in a central part, and said method further comprises removing the photosensitive resin so that said element comprises a central hole.

13. The method as claimed in claim 8, wherein the cavity extends outside a plane of the structure and is shaped such that after the step of forming said element, the element defines a pinion, a cam or a chronograph heart-piece.

14. The method as claimed in claim 12, wherein the central hole is configured to receive a support member.

15. The method as claimed in claim 14, wherein the timepiece component is a balance, an oscillating mass or a wheel.

* * * * *